United States Patent
Sharma et al.

(10) Patent No.: US 11,145,737 B2
(45) Date of Patent: Oct. 12, 2021

(54) SELECTOR DEVICES

(71) Applicant: Intel Corporation, Santa Clara, CA (US)

(72) Inventors: Abhishek A. Sharma, Hillsboro, OR (US); Ravi Pillarisetty, Portland, OR (US); Van H. Le, Portland, OR (US); Gilbert W. Dewey, Beaverton, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/642,254

(22) PCT Filed: Sep. 26, 2017

(86) PCT No.: PCT/US2017/053363
§ 371 (c)(1),
(2) Date: Feb. 26, 2020

(87) PCT Pub. No.: WO2019/066769
PCT Pub. Date: Apr. 4, 2019

(65) Prior Publication Data
US 2021/0074825 A1    Mar. 11, 2021

(51) Int. Cl.
*H01L 27/24* (2006.01)
*H01L 29/47* (2006.01)
*H01L 27/22* (2006.01)
*H01L 29/861* (2006.01)
*H01L 29/872* (2006.01)
*H01L 29/24* (2006.01)

(52) U.S. Cl.
CPC ............ *H01L 29/47* (2013.01); *H01L 27/224* (2013.01); *H01L 27/2409* (2013.01); *H01L 29/8615* (2013.01); *H01L 29/872* (2013.01); *H01L 29/24* (2013.01)

(58) Field of Classification Search
CPC ............... H01L 27/224; H01L 27/2409; H01L 29/8615; H01L 29/872
See application file for complete search history.

(56) References Cited

U.S. PATENT DOCUMENTS

2010/0044806 A1    2/2010    Hou et al.
2011/0226299 A1    9/2011    Makansi
(Continued)

FOREIGN PATENT DOCUMENTS

WO    2019066769 A1    4/2019

OTHER PUBLICATIONS

PCT Jun. 18, 2018—International Search Report and Written Opinion of the International Searching Authority for International Application No. PCT/US2017/053363; 13 pages.
(Continued)

*Primary Examiner* — Thomas L Dickey
(74) *Attorney, Agent, or Firm* — Patent Capital Group (57) ABSTRACT

Disclosed herein are selector devices, and related devices and techniques. In some embodiments, a selector device may include a first electrode, a second electrode, a selector material between the first electrode and the second electrode, and a getter layer between the first electrode and the selector material. The first electrode may include a material having a work function that is less than 4.5 electron volts.

20 Claims, 4 Drawing Sheets

(56) References Cited

U.S. PATENT DOCUMENTS

2012/0313069 A1* 12/2012 Wang .................. H01L 45/1633
257/4
2014/0061815 A1  3/2014 Jagannathan et al.
2015/0155485 A1  6/2015 Chiang et al.
2015/0188039 A1  7/2015 Wang et al.

OTHER PUBLICATIONS

Lee et al., "A plasma-treated chalcogenide switch device for stackable scalable 3D nanoscale memory," Nature Communications, 4:2629, Oct. 16, 2013.

* cited by examiner

SELECTOR DEVICES

CROSS-REFERENCE TO RELATED APPLICATION

This application is a national stage application under 35 U.S.C. § 371 of PCT International Application Serial No. PCT/US2017/053363, filed on Sep. 26, 2017 and entitled "SELECTOR DEVICES," which is hereby incorporated by reference herein in its entirety.

BACKGROUND

A selector device is a device exhibiting a volatile change in resistance between two terminals. In an off state, a selector device may exhibit high resistance; in an on state, a selector device may exhibit low resistance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Disclosed herein are selector devices, and related devices and techniques. In some embodiments, a selector device may include a first electrode, a second electrode, a selector material between the first electrode and the second electrode, and a getter layer between the first electrode and the selector material. The first electrode may include a material having a work function that is less than 4.5 electron volts.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. For ease of illustration, the collection of drawings of FIGS. 2A-2B may be referred to as "FIG. 2."

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C). As used herein, a "dopant" refers to an impurity material that is included in another material to alter the electrical properties of the other material.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The disclosure may use the singular term "layer," but the term "layer" should be understood to refer to assemblies that may include multiple different material layers. The accompanying drawings are not necessarily drawn to scale.

Figure 1A:
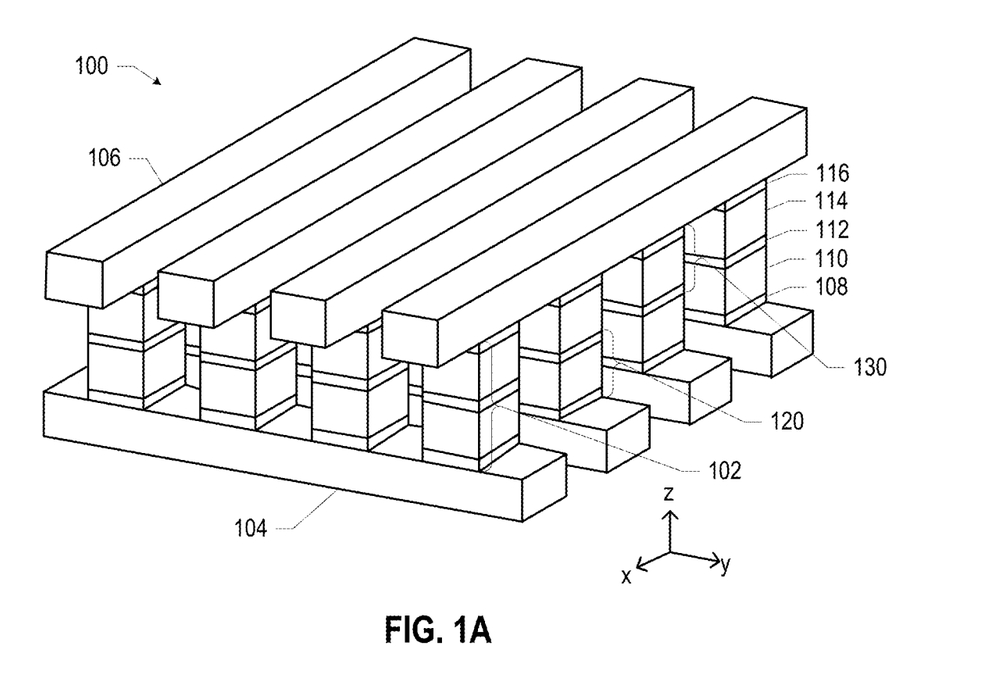
FIG. 1A is a perspective view of a portion of a memory array including a selector device, in accordance with various embodiments.

FIG. 1A is a perspective view of a portion of a memory array 100 including a selector device 130, in accordance with various embodiments. The memory array 100 may be a cross-point array including memory cells 102 located at the intersections of conductive lines 104 and conductive lines 106. In some embodiments, the conductive lines 104 may be word lines and the conductive lines 106 may be bit lines, for example; for ease of discussion, this terminology may be used herein to refer to the conductive lines 104 and the conductive lines 106. In the embodiment illustrated in FIG. 1A, the word lines 104 may be parallel to each other and may be arranged perpendicularly to the bit lines 106 (which themselves may be parallel to each other), but any other suitable arrangement may be used. The word lines 104 and/or the bit lines 106 may be formed of any suitable conductive material, such as a metal (e.g., tungsten, copper, titanium, or aluminum). In some embodiments, the memory array 100 depicted in FIG. 1A may be a portion (e.g., a level) of a three-dimensional array in which other memory arrays like the memory array 100 of FIG. 1A are located at different levels (e.g., above or below the memory array 100).

Each memory cell 102 may include a storage element 120 coupled in series with an associated selector device 130. Generally, a storage element 120 may be programmed to a target data state (e.g., corresponding to a particular resistance state) by applying an electric field or energy (e.g., positive or negative voltage or current pulses) to the storage element 120 for a particular duration. In some embodiments, a storage element 120 may include a memory material 110 disposed between a pair of electrodes 108 and 112. The storage element 120 may be, for example, a resistive storage element (also referred to herein as a "resistive switch") that, during operation, switches between two different non-volatile states: a high resistance state (HRS) and a low resistance state (LRS). The state of a resistive storage element may be used to represent a data bit (e.g., a "1" for HRS and a "0" for LRS, or vice versa). A resistive storage element may have a voltage threshold beyond which the resistive storage element is in the LRS; driving a resistive storage element into the LRS may be referred to as SET (with an associated SET threshold voltage). Similarly, a resistive storage element may have a voltage threshold beyond which the resistive storage element is in the HRS; driving a resistive storage element into the HRS may be referred to as RESET (with an associated RESET threshold voltage).

The storage element 120 may be, for example, a resistive random access memory (RRAM) device; in such embodiments, the memory material 110 may include an oxygen exchange layer (e.g., hafnium) and an oxide layer, as known in the art. The storage element 120 may be, for example, a metal filament memory device (e.g., a conductive bridging random access memory (CBRAM) device), in such embodiments, the memory material 110 may include a solid electrolyte, one of the electrodes 108 and 112 may be an electrochemically active material (e.g., silver or copper), and the other of the electrodes 108 and 112 may be an inert material (e.g., an inert metal), as known in the art. A chemical barrier layer (e.g., tantalum, tantalum nitride, or tungsten) may be disposed between the electrochemically active electrode and the solid electrolyte to mitigate diffusion of the electrochemically active material into the solid electrolyte, in some such embodiments. In some embodiments, the storage element 120 may be a phase change memory (PCM) device; in such embodiments, the memory material 110 may include a chalcogenide or other phase change memory material. In some embodiments, the storage element 120 may be a magnetoresistive random access memory (M RAM) device; in such embodiments, the electrodes 108 and 112 may be magnetic (e.g., ferromagnetic), and the memory material 110 may be a thin tunnel barrier material. As known in the art, MRAM devices may operate on the principle of tunnel magnetoresistance between two magnetic layers (the electrodes 108 and 112) separated by a tunnel junction (the memory material 110). An MRAM device may have two stable states: when the magnetic moments of the two magnetic layers are aligned parallel to each other, an MRAM device may be in the LRS, and when aligned antiparallel, an MRAM device may be in the HRS.

The selector device 130 may be a device (with two or more terminals) that may act as a bipolar switch, controlling the flow of current through the storage element 120. In some embodiments, the selector device 130 may include a selector material 114 disposed between a pair of electrodes 112 and 116. Note that, in the embodiment illustrated in FIG. 1A, the electrode 112 of the selector device 130 is "shared" with the storage element 120 in that the electrode 112 acts as an electrode for the selector device 130 and for the storage element 120. In other embodiments of the memory cell 102, the selector device 130 may not share any electrodes with the storage element 120. During manufacture of the memory cell 102, the selector device 130 may be fabricated before or after the storage element 120 is fabricated. Various embodiments of the selector device 130 are discussed in detail below.

Figure 1B:
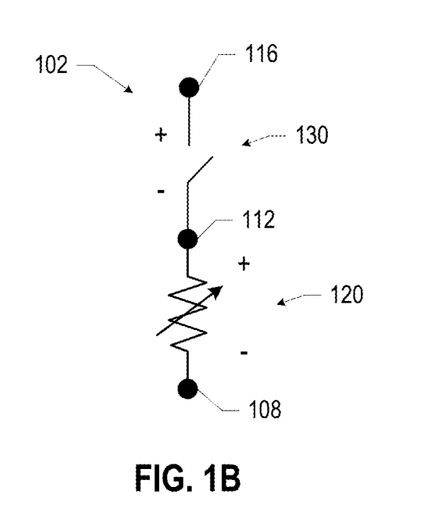
FIG. 1B is a schematic illustration of a memory cell of the memory array of FIG. 1A, in accordance with various embodiments.
Figure 1C:
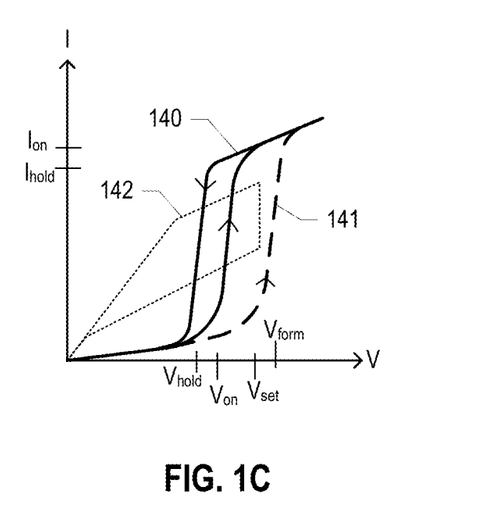
FIG. 1C is a plot depicting example characteristic voltages of the selector device and the storage element of the memory cell of FIGS. 1A and 1B, in accordance with various embodiments.

As illustrated in the schematic view in FIG. 1B of the memory cell 102, when the selector device 130 is in a conductive (i.e., low resistance) state, the "switch" may be closed; when the selector device 130 is in a non-conductive (i.e., high resistance) state, the "switch" may be open. The state of the selector device 130 may change in response to the voltage applied across the selector device 130. FIG. 1C illustrates example electrical characteristics of an example selector device 130 and an example storage element 120 when positive voltages are applied. The I-V characteristic 140 represents behavior of an example selector device 130, and the I-V characteristic 142 represents behavior of an example storage element 120.

As illustrated in FIG. 1C, the selector device 130 may be in a high resistance state (an "off state") when the voltage across the selector device 130 increases from zero to the threshold voltage Von. When the voltage across the selector device 130 reaches and exceeds the threshold voltage Von (and an associated on stage current Ion), the selector device 130 may enter a low resistance state (an "on state") and may conduct current of a positive polarity. When the voltage across the selector device 130 is decreased from the threshold voltage Von, the selector device 130 may remain in the on stage until a holding voltage Vhold (and an associated holding current Ihold) is reached. When the voltage across the selector device decreases to and beyond the holding voltage Vhold, the selector device 130 may enter the off state again. In some embodiments, the selector devices 130 disclosed herein may have a threshold voltage Von between 0.4 volts and 2.5 volts, or 1 volt or less. In some embodiments, the selector devices 130 disclosed herein may have an on stage current Ion that is greater than or equal to 0.5 megaamperes per square centimeter. In some embodiments, the selector devices 130 disclosed herein may have a holding voltage Vhold between 0.1 volts and 2.5 volts (e.g., between 0.1 volts and 1 volt for embedded applications, and between 0.5 volts and 2 volts for standalone applications).

Note that the holding voltage Vhold may be less than the threshold voltage Von, as illustrated in FIG. 1C. In some embodiments, it may be desirable for the holding voltage Vhold to be approximately the same, as or close to, the threshold voltage Von. In other embodiments, it may be desirable for the holding voltage Vhold to be less than the threshold voltage Von. For example, when the holding voltage Vhold is less than the threshold voltage Von, the voltage across an "on" selector device 130 may be decreased from the threshold voltage Von and the selector device 130 may remain in the on state; this may reduce the power required to keep the selector device 130 on (e.g., during a read operation of the associated storage element 120), and thus may improve power efficiency. The materials used in the electrodes 112/116 of the selector device 130 may allow tuning of the holding voltage Vhold and/or the threshold voltage Von, as discussed in further detail below.

Some selector devices 130 may require or benefit from the application of an initial formation voltage Vform that is larger than the threshold voltage Von when the selector device is first used; FIG. 1C includes a curve 141 illustrating an example initial formation phase. This initial formation phase (sometimes referred to as "first fire") may "break down" the selector material 114 (e.g., by introducing some of the material of the electrodes 112 and 116 into the selector material 114, or creating regions of inhomogeneous material composition in the selector material 114) so as to allow subsequent on/off behavior as described above.

As noted above, FIG. 1C also depicts an example I-V characteristic 142 for a storage element 120 (e.g., an RRAM device) with a SET threshold voltage Vset. The SET threshold voltage Vset may be greater than the threshold voltage Von for the selector device 130.

Disclosed herein are selector devices 130 having electrodes 116 whose material compositions may be chosen, among other factors, to achieve a desired holding voltage Vhold and/or a desired threshold voltage Von. The holding voltage Vhold may contribute to setting the peak power of a selector device 130 (e.g., reducing Vhold may reduce the power dissipated by the selector device 130), and thus it may be advantageous to engineer a selector device 130 to achieve a desired peak power to achieve a desired power consumption during switching. Some of these selector devices 130 may advantageously exhibit decreased threshold voltages Von relative to conventional selector devices, resulting in improved performance and decreased power consumption. A selector device 130 with a lower threshold voltage Von may be turned on and off with lower applied voltages, and thus may enable new low power applications (e.g., embedded electronics, or integrated circuits in other low power environments). Additionally, achieving a desired holding voltage Vhold for a selector device 130 may also improve power efficiency and behavior.

Figure 2A:
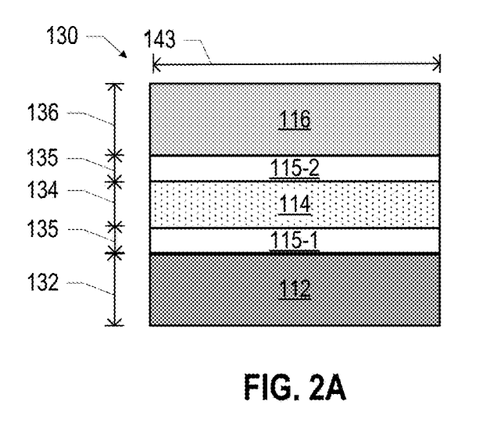
FIG. 2A-2B are cross-sectional views of example selector devices, in accordance with various embodiments.
Figure 2B:
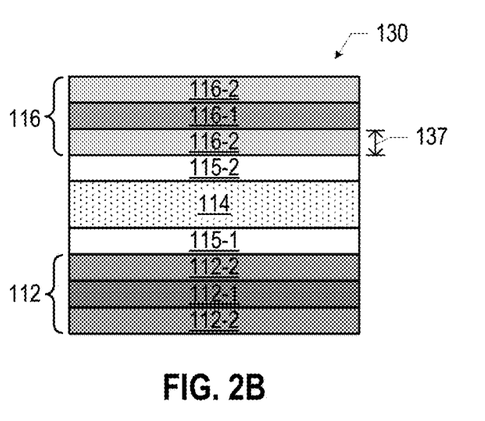

The selector devices 130 disclosed herein, and the associated memory cells 102, may take any of a number of forms. For example, FIGS. 2A and 2B are cross-sectional views of different embodiments of a selector device 130, in accordance with various embodiments. The selector devices 130 of FIG. 2 may include an electrode 116, an electrode 112, and a selector material 114 between the electrodes 116 and 112. During operation, one of the electrodes 112/116 of the selector device 130 may be at a more positive potential than the other electrode; this "more positive" electrode of the electrodes 112/116 may be referred to as the "injecting" electrode, while the "more negative" electrode of the electrodes 112/116 may be referred to as the "non-injecting" electrode.

FIG. 2 also illustrates a getter layer 115-1 between the selector material 114 and the electrode 112, and a getter layer 115-2 between the selector material 114 and the electrode 116. A getter layer 115 may serve to, among other things, trap unwanted impurities in the selector material 114. In some embodiments, a getter layer 115 may include a material having a relatively low work function (e.g., less than 4.5 electron volts, as discussed below) and a relatively high oxide formation energy. In some embodiments, a getter layer 115 may include tantalum (e.g., tantalum nitride), titanium (e.g., titanium nitride), hafnium, aluminum, or chromium. Various embodiments of the selector devices 130 disclosed herein may include fewer getter layers 115 than are depicted in FIG. 2; in some embodiments, the selector device 130 may include a getter layer 115-1 but not a getter layer 115-2, or may include a getter layer 115-2 but not a getter layer 115-2, or may not include any getter layers 115. For example, when an electrode 112/116 includes a relatively low reactivity material (such as copper or tungsten), the adjacent getter layer 115 may be omitted.

The electrodes 112 and 116 may be formed of any suitable material. In some embodiments, the electrodes 112 and 116 may include tantalum, platinum, hafnium, cobalt, indium, iridium, copper, tungsten, ruthenium, palladium, and/or carbon. The electrodes 112 and 116 may be composed of pure forms of these elements, combinations of these elements, or combinations of these elements and other elements, in some embodiments. For example, in some embodiments, the electrode 112 and/or the electrode 116 may include a conductive nitride (e.g., tantalum nitride or titanium nitride). In some embodiments, the material compositions of the electrodes 112 and 116 may be the same, while in other embodiments, the material compositions of the electrodes 112 and 116 may be different.

In some embodiments, the electrode 112 or the electrode 116 may include a material having a work function that is less than 4.5 electron volts (referred to herein as a "low work function material"). Examples of such materials may include carbon, tantalum, titanium, and hafnium. In some embodiments, an electrode 112/116 including a low work function material (referred to herein as a "low work function electrode") may be the injecting electrode. Using a low work function material in the injecting electrode 112/116 may reduce the Schottky barrier height of the electrode 112/116, reducing the contact resistance of the electrode 112/116 and reducing the value of the threshold voltage Von. The threshold voltage Von may thus be adjusted by, among other factors, appropriately selecting the low work function material included in the injecting electrode 112/116. When a low work function electrode 112/116 acts as the injecting electrode, an adjacent getter layer 115 may be included in the selector device 130; the getter layer 115 may mitigate gettering of the low work function electrode 112/116.

In some embodiments, one of the electrodes 112/116 may be a low work function electrode, and the other of the electrodes 112/116 may include a material having a work function that is greater than 4.5 electron volts (referred to herein as a "high work function material"). Examples of high work function materials may include gold, platinum, ruthenium, and copper, among others. An electrode 112/116 including a high work function material may be referred to herein as a "high work function electrode"). In some particular embodiments, the low work function electrode 112/116 may be the injecting electrode, and the high work function electrode 112/116 may be the non-injecting electrode. When a low work function electrode 112/116 is the injecting electrode, using a high work function electrode 112/116 as the non-injecting electrode may reduce the holding voltage Vhold (and maintain the threshold voltage Von) relative to an embodiment in which a low work function electrode 112/116 is the non-injecting electrode. Thus, by selecting the materials of the injecting and non-injecting electrodes 112/116, the threshold voltage Von and the holding voltage Vhold may be tuned to desired levels.

In some particular embodiments, the low work function electrode 112/116 may be the non-injecting electrode, and the high work function electrode 112/116 may be the injecting electrode. When a low work function electrode 112/116 is the non-injecting electrode, using a high work function electrode 112/116 as the injecting electrode may reduce the threshold voltage Von (and maintain the holding voltage Vhold) relative to an embodiment in which a low work function electrode 112/116 is the injecting electrode. Thus, as noted above, by selecting the materials of the injecting and non-injecting electrodes 112/116, the threshold voltage Von and the holding voltage Vhold may be tuned to desired levels.

In some embodiments, a selector device 130 may include a getter layer 115 on the non-injecting electrode 112/116. In particular, a selector device 130 may include the getter layer 115-1 if the non-injecting electrode is the electrode 112, or the selector device 130 may include the getter layer 115-2 if the non-injecting electrode is the electrode 116. The use of a getter layer 115 on a non-injecting electrode 112/116 may cause vacancy doping in the selector material 114, and thus may reduce the effective thickness of the selector material 114. Consequently, the contact resistance at the non-injecting electrode 112/116 may decrease relative to an embodiment in which the getter layer 115 is not present, lowering the threshold voltage Von and the holding voltage Vhold.

In some embodiments, the selector material 114 may include niobium, tantalum, vanadium, titanium, or hafnium. For example, the selector material 114 may be an oxide material (e.g., niobium oxide, tantalum oxide, vanadium oxide, titanium oxide, or hafnium oxide) that may be capable of undergoing an insulator-to-metal transition in response to an applied voltage or resistance. For example, the selector material 114 may be $TaO_{0.5-1.7}$ (e.g., $TaO_{1.5}$). In some embodiments, the selector material 114 may be a non-oxide material. For example, the dielectric material may be a chalcogenide material, a multi-component material including group IV or group VI elements, such as silicon and tellurium. Examples of chalcogenides that may serve as the selector material 114 may include germanium silicon selenium, germanium silicon tellurium, and silicon tellurium arsenic germanium, among others.

In some embodiments of the selector devices 130 disclosed herein, the geometries of the electrodes 112 and 116 may be the same, or may differ. For example, the electrodes 112 and 116 may have the same or different surface areas. In some embodiments, the cross-sectional width 143 of the electrode 112, the selector material 114, the getter layer(s) 115, and/or the electrode 116 may be between 5 nanometers and 50 nanometers.

The thicknesses of the materials included in the selector device 130 of FIG. 2 may take any suitable values. For example, in some embodiments, the electrode 112 may have a thickness 132 between 1 nanometer and 100 nanometers, the selector material 114 may have a thickness 134 between 2 nanometers and 80 nanometers, the getter layer(s) 115 may have a thickness 135 between 0.5 nanometers and 50 nanometers, and the electrode 116 may have a thickness 136 between 1 nanometer and 100 nanometers.

For example, one particular embodiment of a selector device 130 may include a tantalum electrode 112 having a thickness 132 of 30 nanometers, a tantalum oxide selector material 114 having a thickness 134 of 28 nanometers, a tantalum getter layer 115-2 having a thickness 135 of 20 nanometers, and a platinum electrode 116 having a thickness 136 of 10 nanometers.

In another example, one particular embodiment of a selector device 130 may include a tantalum electrode 116 having a thickness 136 of 30 nanometers, a tantalum oxide selector material 114 having a thickness 134 of 28 nanometers, a tantalum getter layer 115-1 having a thickness 135 of 20 nanometers, and a platinum electrode 112 having a thickness 132 of 10 nanometers.

In another example, one particular embodiment of a selector device 130 may include a low work function electrode 112 (including, for example, carbon, tantalum, titanium, or hafnium) and a titanium nitride getter layer 115-1 having a thickness 135 between 0.5 nanometers and 2 nanometers (e.g., between 0.5 nanometers and 1 nanometer).

In another example, one particular embodiment of a selector device 130 may include a low work function electrode 116 (including, for example, carbon, tantalum, titanium, or hafnium) and a titanium nitride getter layer 115-2 having a thickness 135 between 0.5 nanometers and 2 nanometers (e.g., between 0.5 nanometers and 1 nanometer).

FIG. 2A illustrates an embodiment of the selector devices 130 in which the electrodes 112/116 each have a substantially uniform composition. FIG. 2B illustrates an embodiment of the selector devices 130 in which the electrode 112 is formed of a bulk conductive material 112-1 having a skin layer 112-2 on opposite faces of the bulk conductive material 112-1, and in which the electrode 116 is formed of a bulk conductive material 116-1 having a skin layer 116-2 on opposite faces of the bulk conductive material 116-1. In some embodiments of the selector devices 130 disclosed herein, one of the electrodes 112/116 may have a uniform material composition (as illustrated in FIG. 2A) while the other of the electrodes 112/116 may include a skin layer.

The bulk conductive materials 112-1/116-1 may include any suitable conductive materials, such as metals or other conductive materials (e.g., tantalum, titanium, tungsten, copper, carbon, metal nitrides such as titanium nitride or tantalum nitride, etc.). The skin layers 112-2/116-2 may take the form of any of the materials discussed above with reference to the electrodes 112 and 116. For example, in some embodiments, a low work function electrode 112/116 may have a skin layer 112-2/116-2 including a low work function material, while the bulk conductive material 112-1/116-1 may or may not include a low work function material. Similarly, in some embodiments, a high work function electrode 112/116 may have a skin layer 112-2/116-2 including a high work function material, while the bulk conductive material 112-1/116-1 may or may not include a high work function material.

In some embodiments, a thickness 137 of a skin layer 112-2/116-2 may be greater than 1 nanometer (e.g., between 1 nanometer and 10 nanometers, or between 1 nanometer and 20 nanometers). The other dimensions of the selector device 130 of FIG. 2B may take any of the forms discussed above.

Figure 3:
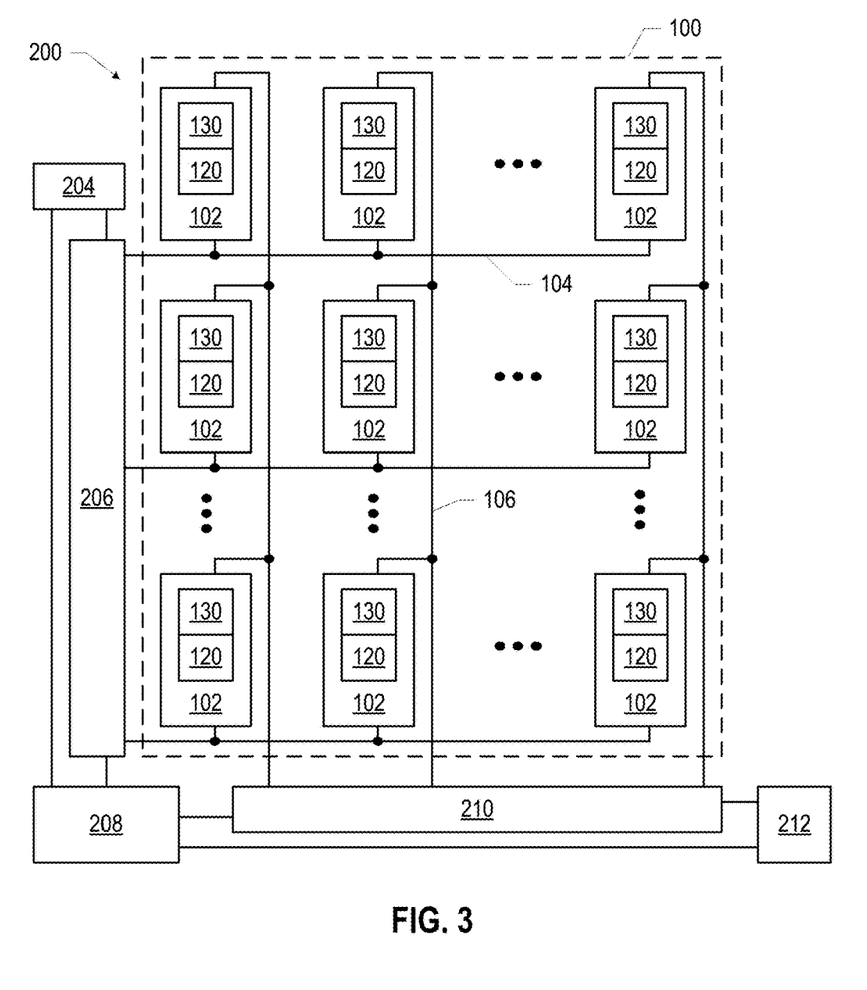
FIG. 3 is a schematic illustration of a memory device including selector devices, in accordance with various embodiments.

A memory array 100 including a selector device 130 may be controlled in any suitable manner. For example, FIG. 3 is a schematic illustration of a memory device 200 including a memory array 100 having memory cells 102 with storage elements 120 and selector devices 130, in accordance with various embodiments. As discussed above, each memory cell 102 may include a storage element 120 connected in series with any of the embodiments of the selector devices 130 disclosed herein. The memory device 200 of FIG. 3 may be a bidirectional cross-point array in which each column is associated with a bit line 106 driven by column select circuitry 210. Each row may be associated with a word line 104 driven by row select circuitry 206. During operation, read/write control circuitry 208 may receive memory access requests (e.g., from one or more processing devices or communication chips of a computing device, such as the computing device 2000 discussed below), and may respond by generating an appropriate control signal (e.g., read, write 0, or write 1), as known in the art. The read/write control circuitry 208 may control the row select circuitry 206 and the column select circuitry 210 to select the desired memory cell(s) 102. Voltage supplies 204 and 212 may be controlled to provide the voltage(s) necessary to bias the memory array 100 to facilitate the requested action on one or more memory cells 102. Row select circuitry 206 and column select circuitry 210 may apply appropriate voltages across the memory array 100 to access the selected memory cells 102 (e.g., by providing appropriate voltages to the memory cells 102 to allow the desired selector devices 130 to conduct). Row select circuitry 206, column select circuitry 210, and read/write control circuitry 208 may be implemented using any devices and techniques known in the art.

Figure 4:
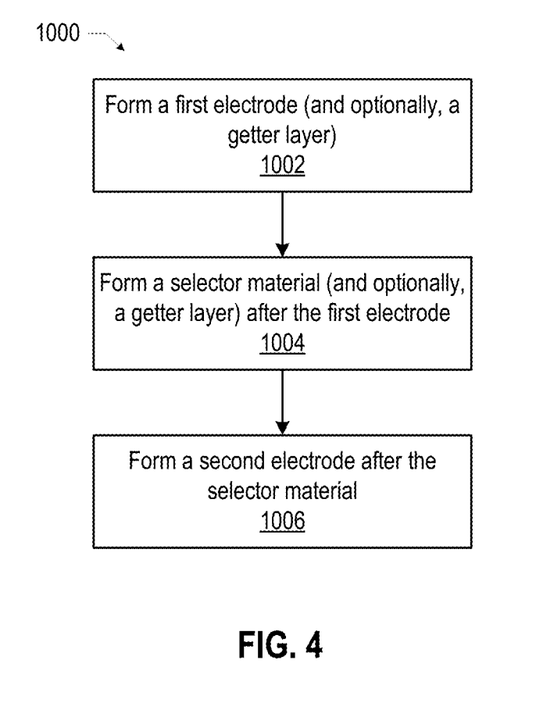
FIG. 4 is a flow diagram of an illustrative method of manufacturing a selector device, in accordance with various embodiments.

Any suitable techniques may be used to manufacture the selector devices 130 and memory cells 102 disclosed herein. FIG. 4 is a flow diagram of an illustrative method 1000 of manufacturing a selector device, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable selector device (including any suitable ones of the embodiments disclosed herein).

At 1002, a first electrode (and optionally, a getter layer) may be formed (e.g., by physical vapor deposition (PVD), such as sputtering). For example, the electrode 112 may be formed on memory material 110 of a storage element 120. The first electrode may take any of the forms disclosed herein with reference to the electrodes 112/116. In embodiments in which a getter layer is formed at 1002, the getter layer may take any of the forms disclosed herein.

At 1004, a selector material (and optionally, a getter layer) may be formed after the first electrode. For example, the selector material 114 may be formed after the electrode 112, The selector material may take any of the forms disclosed herein, Any suitable technique may be used to form the selector material at 1004, such as a PVD or an atomic layer deposition (ALD) technique. In embodiments in which a getter layer is formed at 1004, the getter layer may take any of the forms disclosed herein.

At 1006, a second electrode may be formed after the selector material. For example, the electrode 116 may be formed after the selector material 114. The second electrode may take any of the forms disclosed herein.

Figure 5:
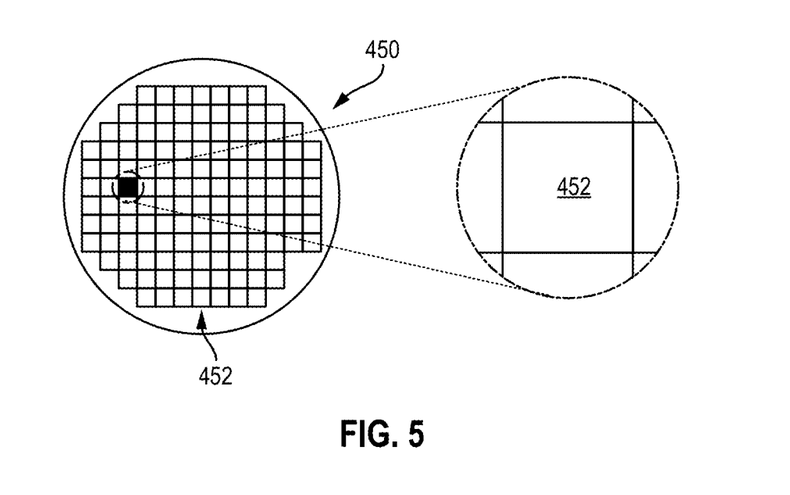
FIG. 5 depicts top views of a wafer and dies that may include any of the selector devices or memory cells disclosed herein.

The selector devices 130 and memory cells 102 disclosed herein may be included in any suitable electronic device. FIG. 5 depicts top views of a wafer 450 and dies 452 that may be formed from the wafer 450; the dies 452 may include any of the selector devices 130 or memory cells 102 disclosed herein. The wafer 450 may include semiconductor material and may include one or more dies 452 having integrated circuit elements (e.g., selector devices 130 and storage elements 120) formed on a surface of the wafer 450. Each of the dies 452 may be a repeating unit of a semiconductor product that includes any suitable device (e.g., the memory device 200). After the fabrication of the semiconductor product is complete, the wafer 450 may undergo a singulation process in which the dies 452 are separated from one another to provide discrete "chips" of the semiconductor product. A die 452 may include one or more selector devices 130 or memory cells 102 and/or supporting circuitry to route electrical signals to the selector devices 130 or memory cells 102 (e.g., interconnects including conductive lines 104 and 106), as well as any other integrated circuit (IC) components. In some embodiments, the wafer 450 or the die 452 may include other memory devices, logic devices (e.g., AND, OR, NAND, or NOR gates), or any other suitable circuit element. Multiple ones of these devices may be combined on a single die 452. For example, a memory device formed by multiple memory arrays (e.g., multiple memory arrays 100) may be formed on a same die 452 as a processing device (e.g., the processing device 2002 of FIG. 7) or other logic that is configured to store information in the memory devices or execute instructions stored in the memory array.

Figure 6:
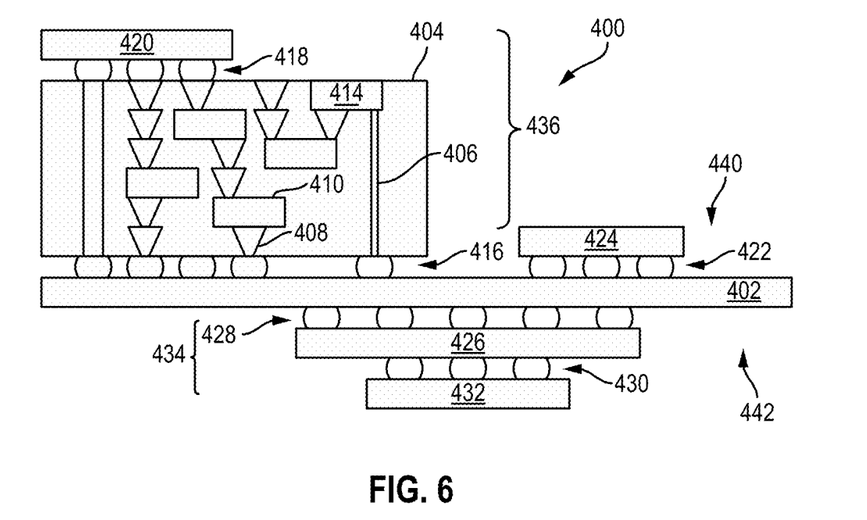
FIG. 6 is a cross-sectional side view of a device assembly that may include any of the selector devices or memory cells disclosed herein.

FIG. 6 is a cross-sectional side view of a device assembly 400 that may include any of the selector devices 130 or memory cells 102 disclosed herein in one or more packages. A "package" may refer to an electronic component that includes one or more IC devices that are structured for coupling to other components; for example, a package may include a die coupled to a package substrate that provides electrical routing and mechanical stability to the die. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 6 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls, male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. Although a single package 420 is shown in FIG. 6, multiple packages may be coupled to the interposer 404; indeed, additional interposers may be coupled to the interposer 404. The interposer 404 may provide an intervening substrate used to bridge the circuit board 402 and the package 420. The package 420 may include one or more selector devices 130 or memory cells 102, for example. Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 6, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices (e.g., the selector devices 130 or memory cells 102). More complex devices such as radio frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may include one or more selector devices 130 or memory cells 102, for example.

The device assembly 400 illustrated in FIG. 6 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may include one or more selector devices 130 or memory cells 102, for example.

Figure 7:
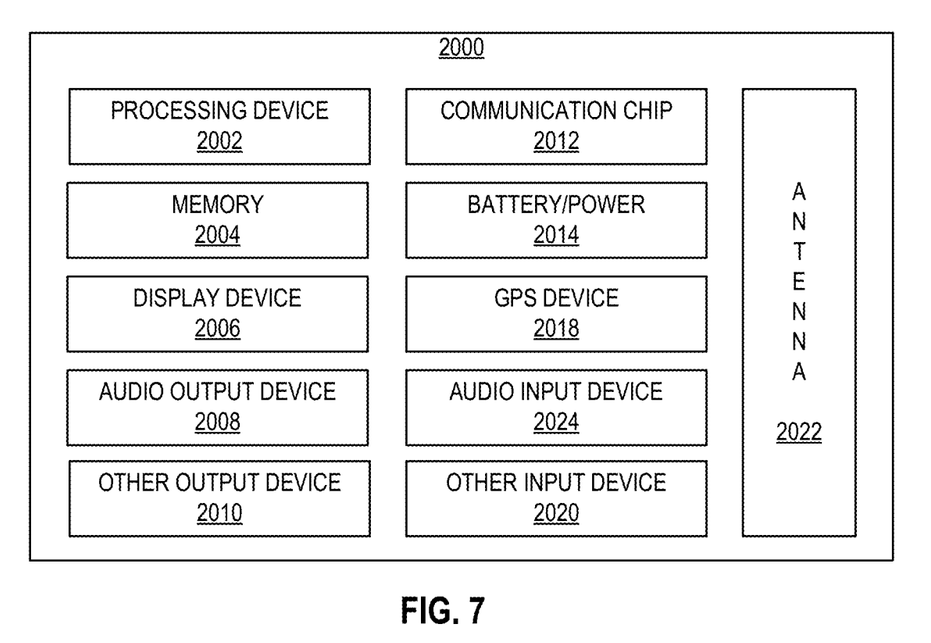
FIG. 7 is a block diagram of an example computing device that may include any of the selector devices or memory cells disclosed herein, in accordance with various embodiments.

FIG. 7 is a block diagram of an example computing device 2000 that may include any of the selector devices 130 or memory cells 102 disclosed herein. A number of components are illustrated in FIG. 7 as included in the computing device 2000, but any one or more of these components may be omitted or duplicated, as suitable for the application. In some embodiments, some or all of the components included in the computing device 2000 may be attached to one or more PCBs (e.g., a motherboard). In some embodiments, various ones of these components may be fabricated onto a single system-on-a-chip (SoC) die. Additionally, in various embodiments, the computing device 2000 may not include one or more of the components illustrated in FIG. 7, but the computing device 2000 may include interface circuitry for coupling to the one or more components. For example, the computing device 2000 may not include a display device 2006, but may include display device interface circuitry (e.g., a connector and driver circuitry) to which a display device 2006 may be coupled. In another set of examples, the computing device 2000 may not include an audio input device 2024 or an audio output device 2008, but may include audio input or output device interface circuitry (e.g., connectors and supporting circuitry) to which an audio input device 2024 or audio output device 2008 may be coupled.

The computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may interface with one or more of the other components of the computing device 2000 (e.g., the communication chip 2012 discussed below, the display device 2006 discussed below, etc.) in a conventional manner. The processing device 2002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 2000 may include a memory 2004, which may itself include one or more memory devices such as volatile memory (e.g., dynamic random access memory (DRAM)), non-volatile memory (e.g., read-only memory (ROM)), flash memory, solid state memory, and/or a hard drive. The memory 2004 may include one or more selector devices 130 or memory cells 102 or memory arrays 100 or memory devices 200, as disclosed herein. In some embodiments, the memory 2004 may include memory that shares a die with the processing device 2002. This memory may be used as cache memory and may include embedded dynamic random access memory (eDRAM) or spin transfer torque magnetic random access memory (STT-MRAM).

In some embodiments, the computing device 2000 may include a communication chip 2012 (e.g., one or more communication chips). For example, the communication chip 2012 may be configured for managing wireless communications for the transfer of data to and from the computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The computing device 2000 may include an antenna

2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The computing device 2000 may include battery/power circuitry 2014. The battery/power circuitry 2014 may include one or more energy storage devices (e.g., batteries or capacitors) and/or circuitry for coupling components of the computing device 2000 to an energy source separate from the computing device 2000 (e.g., AC line power).

The computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display.

The computing device 2000 may include an audio output device 2008 (or corresponding interface circuitry, as discussed above). The audio output device 2008 may include any device that generates an audible indicator, such as speakers, headsets, or earbuds.

The computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The computing device 2000 may include a GPS device 2018 (or corresponding interface circuitry, as discussed above). The GPS device 2018 may be in communication with a satellite-based system and may receive a location of the computing device 2000, as known in the art.

The computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide various examples of the embodiments disclosed herein.

Example 1 is a selector device, including: a first electrode, wherein the first electrode includes a material having a work function that is less than 4.5 electron volts; a second electrode; a selector material between the first electrode and the second electrode; and a getter layer between the first electrode and the selector material.

Example 2 may include the subject matter of Example 1, and may further specify that the selector material includes hafnium, tantalum, niobium, vanadium, or titanium.

Example 3 may include the subject matter of Example 2, and may further specify that the selector material includes an oxide.

Example 4 may include the subject matter of any of Examples 1-3, and may further specify that the selector material includes a chalcogenide.

Example 5 may include the subject matter of any of Examples 1-4, and may further specify that the material includes tantalum, titanium, or carbon.

Example 6 may include the subject matter of any of Examples 1-5, and may further specify that the first electrode is substantially uniformly composed of the material.

Example 7 may include the subject matter of any of Examples 1-5, and may further specify that the first electrode includes a skin layer of the material around another material.

Example 8 may include the subject matter of Example 7, and may further specify that the skin layer has a thickness between 1 nanometer and 20 nanometers.

Example 9 may include the subject matter of Example 7, and may further specify that the skin layer has a thickness between 1 nanometer and 10 nanometers.

Example 10 may include the subject matter of any of Examples 1-9, and may further specify that the getter layer includes tantalum, titanium, hafnium, aluminum, or chromium.

Example 11 may include the subject matter of Example 10, and may further specify that the getter layer has a thickness between 0.5 nanometers and 1 nanometer.

Example 12 may include the subject matter of any of Examples 10-11, and may further specify that the getter layer includes a nitride.

Example 13 may include the subject matter of any of Examples 10-12, and may further specify that the getter layer is a first getter layer, and the selector device further includes:

a second getter layer between the second electrode and the selector material.

Example 14 may include the subject matter of Example 13, and may further specify that the second getter layer includes tantalum, titanium, hafnium, aluminum, or chromium.

Example 15 may include the subject matter of any of Examples 13-14, and may further specify that the second getter layer has a thickness between 0.5 nanometers and 1 nanometer.

Example 16 may include the subject matter of any of Examples 13-15, and may further specify that the second getter layer includes a nitride.

Example 17 may include the subject matter of any of Examples 13-16, and may further specify that the material is a first material, and the second electrode includes a second material having a work function that is greater than 4.5 electron volts.

Example 18 may include the subject matter of Example 17, and may further specify that the second material includes gold, platinum, ruthenium, or copper.

Example 19 may include the subject matter of any of Examples 1-18, and may further specify that the material is a first material, and the second electrode includes a second material having a work function that is greater than 4.5 electron volts.

Example 20 may include the subject matter of Example 19, and may further specify that the second material includes gold, platinum, ruthenium, or copper.

Example 21 may include the subject matter of any of Examples 1-20, and may further specify that the selector device has a threshold voltage between 0.4 volts and 2.5 volts.

Example 22 may include the subject matter of any of Examples 1-21, and may further specify that the selector device has a holding voltage between 0.1 volts and 2.5 volts.

Example 23 may include the subject matter of Example 22, and may further specify that the holding voltage is between 0.1 volts and 1 volt.

Example 24 may include the subject matter of Example 22, and may further specify that the holding voltage is between 0.5 volts and 2 volts.

Example 25 may include the subject matter of any of Examples 1-24, and may further specify that the selector device has an on current that is at least 0.5 megaamperes per square centimeter.

Example 26 is a memory cell, including: a storage element; and a selector device coupled to the storage element, wherein the selector device includes a first electrode, a second electrode, a selector material between the first electrode and the second electrode, and a getter layer between the second electrode and the selector material, the first electrode includes a first material having a work function less than 4.5 electron volts, and the second electrode includes a second material having a work function greater than 4.5 electron volts.

Example 27 may include the subject matter of Example 26, and may further specify that the getter layer includes tantalum, titanium, hafnium, aluminum, or chromium.

Example 28 may include the subject matter of any of Examples 26-27, and may further specify that the getter layer has a thickness between 0.5 nanometers and 2 nanometers.

Example 29 may include the subject matter of any of Examples 26-28, and may further specify that the first electrode or the second electrode is also an electrode of the storage element.

Example 30 may include the subject matter of any of Examples 26-29, and may further specify that the getter layer is a first getter layer, and the selector device further includes a second getter layer between the first electrode and the selector material.

Example 31 may include the subject matter of any of Examples 26-30, and may further specify that the storage element is a resistive random access memory (RRAM) device, a phase change memory (PCM) device, a metal filament memory device, or a magnetoresistive random access memory (MRAM) device.

Example 32 may include the subject matter of any of Examples 26-31, and may further specify that the memory cell includes a first terminal coupled to a bit line, and the memory cell includes a second terminal coupled to a word line.

Example 33 is a selector device, including: a first electrode, wherein the first electrode includes a material having a work function that is greater than 4.5 electron volts; a second electrode; a selector material between the first electrode and the second electrode; and a getter layer between the first electrode and the selector material.

Example 34 may include the subject matter of Example 33, and may further specify that the selector material includes hafnium, tantalum, niobium, vanadium, or titanium.

Example 35 may include the subject matter of Example 34, and may further specify that the selector material includes an oxide.

Example 36 may include the subject matter of any of Examples 33-35, and may further specify that the selector material includes a chalcogenide.

Example 37 may include the subject matter of any of Examples 33-36, and may further specify that the material includes gold, platinum, ruthenium, or copper.

Example 38 may include the subject matter of any of Examples 33-37, and may further specify that the first electrode is substantially uniformly composed of the material.

Example 39 may include the subject matter of any of Examples 33-37, and may further specify that the first electrode includes a skin layer of the material around another material.

Example 40 may include the subject matter of Example 39, and may further specify that the skin layer has a thickness between 1 nanometer and 20 nanometers.

Example 41 may include the subject matter of Example 39, and may further specify that the skin layer has a thickness between 1 nanometer and 10 nanometers.

Example 42 may include the subject matter of any of Examples 33-41, and may further specify that the getter layer includes tantalum, titanium, hafnium, aluminum, or chromium.

Example 43 may include the subject matter of Example 42, and may further specify that the getter layer has a thickness between 0.5 nanometers and 1 nanometer.

Example 44 may include the subject matter of Example 42, and may further specify that the getter layer includes a nitride.

Example 45 may include the subject matter of any of Examples 33-44, and may further specify that the material is a first material, and the second electrode includes a second material having a work function that is less than 4.5 electron volts.

Example 46 may include the subject matter of Example 45, and may further specify that the second material includes tantalum, titanium, or carbon.

Example 47 may include the subject matter of any of Examples 33-46, and may further specify that the selector device has a threshold voltage between 0.4 volts and 2.5 volts.

Example 48 may include the subject matter of any of Examples 33-47, and may further specify that the selector device has a holding voltage between 0.1 volts and 2.5 volts.

Example 49 may include the subject matter of Example 48, and may further specify that the holding voltage is between 0.1 volts and 1 volt.

Example 50 may include the subject matter of Example 48, and may further specify that the holding voltage is between 0.5 volts and 2 volts.

Example 51 may include the subject matter of any of Examples 33-50, and may further specify that the selector device has an on current that is at least 0.5 megaamperes per square centimeter.

Example 52 is a computing device, including: a circuit board; a processing device coupled to the circuit board; and a memory array coupled to the processing device, wherein the memory array includes a memory cell having a storage element coupled in series with a selector device, the selector device includes a first electrode, a second electrode, and a selector material, and the first electrode includes a skin layer of a material having a work function less than 4.5 electron volts.

Example 53 may include the subject matter of Example 52, and may further specify that the skin layer is around a bulk conductive material of the first electrode.

Example 54 may include the subject matter of any of Examples 52-53, and may further specify that the selector device further includes a getter layer between the first electrode and the selector material.

Example 55 may include the subject matter of any of Examples 52-54, and may further include a wireless communications device coupled to the circuit board.

Example 56 may include the subject matter of any of Examples 52-55, and may further specify that the storage element includes a resistive switch.

Example 57 may include the subject matter of any of Examples 52-56, and may further specify that the storage element includes a resistive random access memory (RRAM) device, a phase change memory (PCM) device, a metal filament memory device, or a magnetoresistive random access memory (MRAM) device.

The invention claimed is:

1. A selector device, comprising:
a first electrode, wherein the first electrode includes a material having a work function that is less than 4.5 electron volts;
a second electrode;
a selector material between the first electrode and the second electrode; and
a getter layer between the first electrode and the selector material,
wherein the selector material includes a chalcogenide or wherein the first electrode includes a skin layer of the material around the material.

2. The selector device of claim 1, wherein the selector material includes hafnium, tantalum, niobium, vanadium, or titanium.

3. The selector device of claim 2, wherein the selector material includes an oxide.

4. The selector device of claim 1, wherein the material includes tantalum, titanium, or carbon.

5. The selector device of claim 1, wherein the getter layer includes tantalum, titanium, hafnium, aluminum, or chromium.

6. The selector device of claim 5, wherein the getter layer includes a nitride.

7. The selector device of claim 5, wherein the getter layer is a first getter layer, and the selector device further includes:
a second getter layer between the second electrode and the selector material.

8. The selector device of claim 7, wherein the material is a first material, and the second electrode includes a second material having a work function that is greater than 4.5 electron volts.

9. The selector device of claim 8, wherein the second material includes gold, platinum, ruthenium, or copper.

10. The selector device of claim 1, wherein the material is a first material, and the second electrode includes a second material having a work function that is greater than 4.5 electron volts.

11. A memory cell, comprising:
a storage element; and
a selector device coupled to the storage element, wherein:
the selector device includes a first electrode, a second electrode, a selector material between the first electrode and the second electrode, and a getter layer between the second electrode and the selector material,
the first electrode includes a first material having a work function less than 4.5 electron volts,
the second electrode includes a second material having a work function greater than 4.5 electron volts, and
the selector material includes a chalcogenide or the first electrode includes a skin layer of the material around another material.

12. The memory cell of claim 11, wherein the first electrode or the second electrode is also an electrode of the storage element.

13. The memory cell of claim 11, wherein the storage element is a resistive random access memory (RRAM) device, a phase change memory (PCM) device, a metal filament memory device, or a magnetoresistive random access memory (MRAM) device.

14. The memory cell of claim 11, wherein the memory cell includes a first terminal coupled to a bit line, and the memory cell includes a second terminal coupled to a word line.

15. The memory cell of claim 11, wherein the getter layer includes tantalum, titanium, hafnium, aluminum, or chromium.

16. The memory cell of claim 15, wherein the getter layer includes a nitride.

17. A computing device, comprising:
a circuit board;
a processing device coupled to the circuit board; and
a memory array coupled to the processing device, wherein:
the memory array includes a memory cell having a storage element coupled in series with a selector device, the selector device includes a first electrode, a second electrode, and a selector material that includes a chalcogenide, and
the first electrode includes a skin layer of a material having a work function less than 4.5 electron volts.

18. The computing device of claim 17, wherein the memory cell further includes a getter layer between the first electrode and the selector material.

19. The computing device of claim 18, wherein the getter layer including tantalum, titanium, hafnium, aluminum, or chromium.

20. The computing device of claim 19, wherein the getter layer includes a nitride.

* * * * *

UNITED STATES PATENT AND TRADEMARK OFFICE
CERTIFICATE OF CORRECTION

PATENT NO. : 11,145,737 B2
APPLICATION NO. : 16/642254
DATED : October 12, 2021
INVENTOR(S) : Abhishek A. Sharma et al.

It is certified that error appears in the above-identified patent and that said Letters Patent is hereby corrected as shown below:

In the Claims

In Column 17, Claim 1, Line 46, delete "the material" and insert -- another material --, therefor.

Signed and Sealed this
Twenty-third Day of November, 2021

Drew Hirshfeld
*Performing the Functions and Duties of the*
*Under Secretary of Commerce for Intellectual Property and*
*Director of the United States Patent and Trademark Office*